(12) United States Patent
Chung et al.

(10) Patent No.: US 11,791,165 B2
(45) Date of Patent: *Oct. 17, 2023

(54) METHOD OF DRY ETCHING COPPER THIN FILM AND SEMICONDUCTOR DEVICE

(71) Applicant: SAMSUNG ELECTRONICS CO., LTD., Suwon-si (KR)

(72) Inventors: Cheewon Chung, Seoul (KR); Jaesang Choi, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/460,700

(22) Filed: Aug. 30, 2021

(65) Prior Publication Data

US 2021/0391187 A1 Dec. 16, 2021

Related U.S. Application Data

(63) Continuation of application No. 16/728,342, filed on Dec. 27, 2019, now Pat. No. 11,257,684.

(30) Foreign Application Priority Data

Dec. 28, 2018 (KR) .......................... 10-2018-0172134

(51) Int. Cl.
*H01L 21/3213* (2006.01)
*H01L 21/3065* (2006.01)
(Continued)

(52) U.S. Cl.
CPC .......... *H01L 21/32136* (2013.01); *C23F 4/00* (2013.01); *H01L 21/3065* (2013.01); *H01L 21/32139* (2013.01); *H01L 23/53228* (2013.01)

(58) Field of Classification Search
None
See application file for complete search history.

(56) References Cited

U.S. PATENT DOCUMENTS

| 5,591,302 | A | 2/1997 | Shinohara et al. |
| 6,547,978 | B2 | 4/2003 | Ye et al. |

(Continued)

FOREIGN PATENT DOCUMENTS

| JP | H04-199819 A | 7/1992 |
| JP | H04-199824 A | 7/1992 |

(Continued)

OTHER PUBLICATIONS

Lee "Chlorine Plasma/Copper Reaction in a New Copper Dry Etching Process", Journal of the Electrochemical Soc., 148, 2001.

(Continued)

*Primary Examiner* — Shamim Ahmed
(74) *Attorney, Agent, or Firm* — Lee IP Law, P.C.

(57) ABSTRACT

A method of etching a copper (Cu) thin film and a Cu thin film prepared therefrom, the method including patterning a hard mask layer on the Cu thin film to form a hard mask on the Cu thin film; forming a plasma of a mixed gas, the mixed gas including an inert gas and an organic chelator material including an amine group, the mixed gas not including a halogen gas or a halide gas; and etching the Cu thin film through the hard mask using the plasma generated in the forming of the plasma of the mixed gas.

17 Claims, 7 Drawing Sheets

(51) Int. Cl.
*C23F 4/00* (2006.01)
*H01L 23/532* (2006.01)

(56) References Cited

U.S. PATENT DOCUMENTS

| | | | |
|---|---|---|---|
| 9,359,679 B2 | 6/2016 | Agarwal et al. | |
| 10,147,613 B2 | 12/2018 | Chen et al. | |
| 2002/0063287 A1* | 5/2002 | Yamazaki | H01L 27/124 |
| | | | 257/E29.151 |
| 2004/0118814 A1* | 6/2004 | Kim | H01L 21/32134 |
| | | | 257/E21.309 |
| 2008/0224092 A1* | 9/2008 | Choung | H01L 21/32134 |
| | | | 252/79.3 |
| 2011/0275220 A1 | 11/2011 | Wu et al. | |
| 2013/0187273 A1 | 7/2013 | Zhang et al. | |
| 2015/0004758 A1* | 1/2015 | Choung | C09K 13/08 |
| | | | 252/79.3 |
| 2016/0042975 A1 | 2/2016 | Ma et al. | |

FOREIGN PATENT DOCUMENTS

| | | |
|---|---|---|
| JP | 2003-526191 | 9/2003 |
| KR | 10-0393967 B | 7/2003 |
| KR | 10-0495856 B1 | 6/2005 |
| KR | 10-2017-0023850 A | 3/2017 |

OTHER PUBLICATIONS

Lee "Hydrogen Bromide Plasma-copper reaction in a new copper etching process", Thin Solid Films, 457 (2004).
Hosol "Lower temperature plasma etching of Cu films using infrared radiation" AIP 63, (1993).
Office action dated Feb. 2, 2019, from corresponding Korean application.
Notice of Allowance dated May 1, 2019, from corresponding Korean application.

* cited by examiner

SPECIMEN STRUCTURE BEFORE
PERFORMING ETCHING

SPECIMEN STRUCTURE AFTER
ETCHING HARD MASK

SPECIMEN STRUCTURE AFTER
ETCHING Cu THIN FILM

SPECIMEN STRUCTURE AFTER
ETCHING Cu THIN FILM

SPECIMEN STRUCTURE AFTER
ETCHING Cu THIN FILM

METHOD OF DRY ETCHING COPPER THIN FILM AND SEMICONDUCTOR DEVICE

CROSS-REFERENCE TO RELATED APPLICATIONS

This is a continuation application based on application Ser. No. 16/728,342, filed Dec. 27, 2019, now U.S. Pat. No. 11,257,684, the entire contents of which is hereby incorporated by reference.

Korean Patent Application No. 10-2018-0172134, filed on Dec. 28, 2018, in the Korean Intellectual Property Office, and entitled: "Method of Dry Etching Copper Thin Film," is incorporated by reference herein in its entirety.

BACKGROUND

1. Field

Embodiments relate to a method of dry etching a copper thin film.

2. Description of the Related Art

Copper (Cu) is widely used as an electrode material in various devices. In semiconductor devices, Cu may be used only in some devices, and aluminum (Al) may be more widely used. As a fine line width of a device is reduced to several nanometers (nm), a density of a current that flows through an Al wiring line may increase. For example, in a metal wiring line manufactured using Al, due to an electron-movement characteristic that deteriorates at high current density, the reliability of a device could deteriorate. An Al electrode and an Al wiring line may not be desirable, and it may be desirable to use a Cu wiring line in place of the Al electrode and the Al wiring line.

Cu has a lower specific resistance value than Al, and a semiconductor device, in which Cu is used may have a higher information processing speed than a semiconductor device, in which Al is used, (Al: 2.7μΩ·cm and Cu: 1.7μΩ·cm). In addition, Cu has a greater number of atoms and a higher melting point than Al, and the resistance against electron transfer is high at high current density.

SUMMARY

The embodiments may be realized by providing a method of etching a copper (Cu) thin film, the method including patterning a hard mask layer on the Cu thin film to form a hard mask on the Cu thin film; forming a plasma of a mixed gas, the mixed gas including an inert gas and an organic chelator material including an amine group, the mixed gas not including a halogen gas or a halide gas; and etching the Cu thin film through the hard mask using the plasma generated in the forming of the plasma of the mixed gas.

The embodiments may be realized by providing a method of etching a copper (Cu) thin film, the method including patterning a hard mask layer on the Cu thin film to form a hard mask on the Cu thin film; forming a plasma of a mixed gas, the mixed gas including piperidine, an alcohol, and inert gas and not including a halogen gas or a halide gas; and etching the Cu thin film through the hard mask using plasma generated by the forming of the plasma of the mixed gas.

The embodiments may be realized by providing a method of etching a copper (Cu) thin film, the method including providing the Cu thin film on a substrate; forming a hard mask layer in the Cu thin film; etching the hard mask layer to form a hard mask on the Cu thin film; and plasma etching the Cu thin film through the hard mask using plasma generated from a mixed gas including an inert gas and an organic chelator material including an amine group.

The embodiments may be realized by providing a copper (Cu) thin film manufactured by the method according to an embodiment, the Cu thin film having a sidewall slope of 70° or greater.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
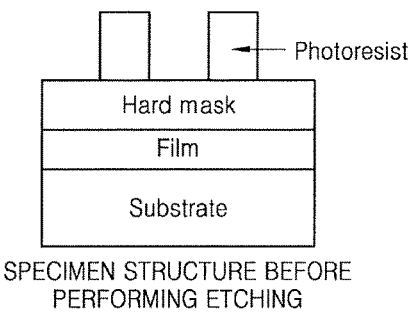
FIG. 1A illustrates a thin film structure before performing etching.

A method of etching a copper (Cu) thin film, according to an embodiment, may include patterning a hard mask layer on the Cu thin film to form a hard mask on the Cu thin film, forming a plasma of a mixed gas, and etching the masked Cu thin film using plasma generated in the forming of the plasma of the mixed gas. The mixed gas may include an inert gas and at least one organic chelator material including amine groups. The mixed gas may not include either a halogen gas or a halide gas (e.g., may not include a halogen-containing gas or a halide-containing gas).

The patterning of the hard mask (and the masking of the Cu thin film) may include patterning a photoresist mask on the hard mask layer/Cu thin film, etching the hard mask layer using the photoresist mask to form a hard mask, and removing the photoresist mask, e.g., patterning the hard mask by using the photoresist mask.

In an implementation, the hard mask may include, e.g., a ceramic such as $SiO_2$ or $Si_3N_4$, a metal such as titanium (Ti), titanium nitride (TiN), tantalum (Ta), or tungsten (W), or amorphous carbon. In an implementation, a material with high etch selectivity, which is etchable by an etching gas at a low etching rate, may be used as the hard mask. In an implementation, $SiO_2$ may be used as the hard mask. As used herein, the term "or" is not an exclusive term, e.g., "A or B" would include A, B, or A and B.

In an implementation, the etch selectivity means an etching rate of the Cu thin film with respect to an etching rate of the hard mask, which may be calculated according to the following equation.

etch selectivity=(the etching rate of the Cu thin film)/(the etching rate of the hard mask)

In an implementation, in the etching processes, the photoresist mask may be patterned to mask the $SiO_2$ hard mask layer and the Cu thin film. Then, using the photoresist mask, the $SiO_2$ hard mask layer may be etched with a plasma generated from a $C_2F_6/Cl_2/Ar$ gas. After etching the $SiO_2$ hard mask layer, the photoresist mask may be removed by using plasma of an oxygen gas and accordingly, the Cu thin film may be masked by the hard mask (e.g., the patterned $SiO_2$ thin film).

In the forming of a plasma of the mixed gas, the organic chelator material including the NH group (amine group) may include, e.g., piperidine, piperazine, triazacyclononane (TACN), 1,4,7,10-tetraazacyclododecane (Cyclen), or 1,4,8,11-tetraazacyclotetradecane (Cyclam).

In an implementation, in the forming of a plasma of the mixed gas, the inert gas may include, e.g., helium (He), neon (Ne), argon (Ar), or $N_2$.

In an implementation, the Cu thin film may be etched by the plasma of the mixed gas of, e.g., the organic chelator material including the NH group (amine) and Ar. In an implementation, the concentration or amount of the organic chelator material (including the NH group) in the mixed gas may be, e.g., 25 vol % to 75 vol %, and a remaining portion of the mixed gas may be the inert gas of, e.g., Ar, in balance.

If pure Ar gas were to be used, physical etching may be performed by Ar ions, and a large amount of re-deposition could occur around the etched Cu thin film. Maintaining the amount of the organic chelator material at 25 vol % or greater may help prevent a large amount of material from being re-deposited on side walls of the Cu thin film. Maintaining the amount of the organic chelator material (including the NH group) at 75 vol % or less may help ensure that, although the Cu thin film is etched, a small amount of material is not deposited on the $SiO_2$ hard mask. If the amount of the organic chelator material were 100 vol %, the Cu thin film would not be etched.

When etching is performed by increasing the concentration of the organic chelator material from 25 vol % to 75 vol %, the amount of material re-deposited on the side walls of the Cu thin film may be gradually reduced and an increased sidewall slope may be obtained. When the concentration of the organic chelator material is 75 vol %, re-deposition may not occur, and the sidewall slope of about 70 degrees may be obtained.

In the forming of the plasma of the mixed gas, the mixed gas may be made into plasma by, e.g., an inductively coupled plasma reactive ion etching method, a high density plasma reactive ion etching method, a magnetic enhanced reactive ion etching method, a reactive ion etching method, an atomic layer etching method, or a pulse modulated high density plasma reactive ion etching method.

In the etching of the Cu thin film using the generated plasma, a temperature of a substrate may be 10° C. to 20° C. During the etching of the Cu thin film, it is not necessary to heat the substrate on which the Cu thin film is loaded and a cooling fluid of 10° C. to 20° C. may be applied to the substrate to etch the Cu thin film at a low temperature. If the substrate were to be heated to 150° C. or higher, a vacuum seal such as an O-ring may not be used under the substrate and accordingly, a special substrate structure may be required and cost of an apparatus increases. In addition, if the substrate were to be heated to a high temperature of 150° C. for a significant time, materials that were previously deposited on the substrate or patterned/etched could diffused and accordingly, undesired materials (e.g., atoms) may migrate upward or downward the Cu thin film layer and change or deteriorate a characteristic of a device.

In an implementation, in the method of etching the Cu thin film, according to the embodiments, etch selectivity of the Cu thin film with respect to the hard mask may be, e.g., about 3 to about 5.

In the method of etching the Cu thin film, according to the embodiments, an optimal etching gas with optimal concentration and an optimal etching process condition may applied to help reduce or prevent re-deposition, in comparison with other methods of etching the Cu thin film, and to provide a high etching rate and a high anisotropic etching profile without forming an etching residue. For example, the method of etching the Cu thin film, according to the embodiments, may be applied to all devices and apparatuses in which the Cu thin film is used.

<Manufacturing Example: Patterning of Hard Mask>

The $SiO_2$ hard mask may be formed by patterning a photoresist by a lithography process and etching the $SiO_2$ thin film with a $C_2F_6/Ar$ gas. The $SiO_2$ thin film etched at a concentration of $C_2F_6$ of 25%~30% may have a perpendicular sidewall slope of no less than 85 degrees.

Figure 1B:
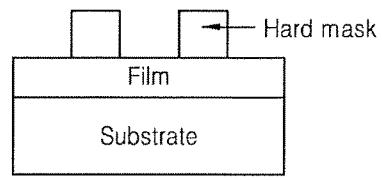
FIG. 1B illustrates a thin film structure after etching a hard mask and before etching a copper (Cu) thin film.
Figure 1C:
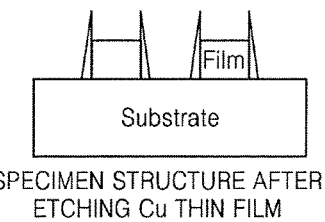
FIG. 1C illustrates a structure of a thin film etched by an ion milling etching method.
Figure 1D:
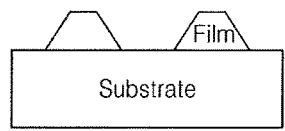
FIGS. 1D and 1E illustrate structures of thin films etched by a reactive ion etching method.
Figure 1E:
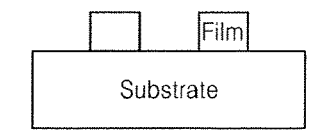

FIG. 1A illustrates a specimen structure before etching the hard mask and the Cu thin film. FIG. 1B illustrates a hard mask (e.g., $SiO_2$)/Cu specimen in which the hard mask has been dry etched with the $C_2F_6/Ar$ gas and has a perpendicular sidewall slope of no less than 85 degrees. FIG. 1C illustrates a result of etching the Cu thin film by using the patterned hard mask in which a large amount of re-deposition materials are formed on side surfaces of the Cu thin film, which is mainly etched by a physical sputtering etching mechanism. In FIG. 1D, after performing the etching, no re-deposition materials may be formed on the etched side surfaces. The sidewall of the etched Cu thin film may be excessively slanted, and a Cu fine pattern of a desired size may not be formed. FIG. 1E illustrates a perpendicular anisotropic etching profile obtained by using a proper etching gas under optimal etching reaction conditions when the Cu thin film is etched.

Figure 2:
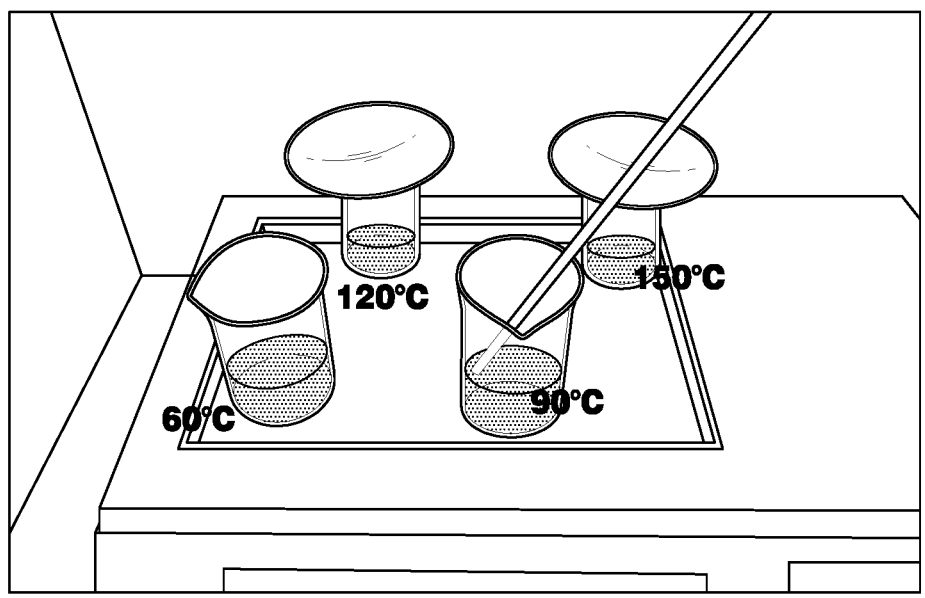
FIG. 2 illustrates a reactive experiment image of a Cu thin film, in which piperidine was used.

FIG. 2 illustrates an experiment in which a piperidine chelator compound (including one NH group) was used, solutions were respectively heated to 60° C., 90° C., 120° C., and 150° C., and the specimen was reacted with the heated solutions or vapors from the heated solutions. For example, after putting certain amounts of piperidine solutions into beakers and changing temperatures of the solutions to 60° C., 90° C., 120° C., and 150° C., reaction speeds between the solutions and gases generated from the solutions were measured.

Table 1, below, illustrates reactivity of the Cu thin film measured by having the Cu thin film react with the heated solutions and the vapors generated therefrom for ten minutes.

Piperidine is liquid at ambient temperature and has a boiling point of 106° C. When the temperature of the solution was 60° C., the Cu thin film was not etched in the solution. When the temperature of the solution is 90° C., the Cu thin film started to be etched. Vapors generated from the piperidine solutions of 60° C. and 90° C. did not react with Cu. However, vapors generated from the piperidine solutions of 120° C. and 150° C. reacted with Cu. Reactivity of the solutions and vapors to Cu increased as temperatures of the solutions increase and accordingly, higher etching rates were obtained.

TABLE 1

| Solution temperature (° C.) | Cu reaction rate in piperidine liquid (Å/min) | Cu reaction rate in piperidine vapor (Å/min) |
|---|---|---|
| 60 | 0 | 0 |
| 90 | 62 | 0 |
| 120 | 94.7 | 52 |
| 150 | 129.2 | 88.4 |

<Measured Reaction Rates Between the Piperidine Solutions Obtained from the Experiment Conditions of FIG. 2 and the Cu Thin Film>

Table 2, below, summarizes a result of an experiment in which a piperazine chelator compound including two NH groups was used. Piperazine is solid at ambient temperature and has a melting point of 106° C. and a boiling point of 146° C. In order to make piperazine liquid at ambient temperature, piperazine was dissolved in ethylene glycol (EG) as a solvent. 400 mg of piperazine was dissolved in 40 ml of ethylene glycol and was heated to 100° C., 130° C., 160° C., and 190° C. The specimen was reacted with the piperazine solution and vapors generated therefrom for ten minutes, and an etching rate of Cu was measured.

In order to investigate whether the solvent, ethylene glycol, reacts with Cu, the same experiment was performed by using only the solvent. In the solvent, ethylene glycol, the reaction rate of Cu was very high and significantly increased with temperature from 26 Å/min at 100° C. to 92 Å/min at 190° C. Furthermore, the reaction rate of Cu in the solution obtained by dissolving piperazine in the solvent, i.e., ethylene glycol, was not significantly different from that of Cu in the solvent and slightly increased, e.g., from 27 Å/min at 100° C. to 98 Å/min at 190° C., This shows that the solvent, ethylene glycol, reacts with Cu. In the experiment illustrating reactivity of vapors of the solutions with Cu, at 100° C., Cu did not react with vapors of the mixed solutions, at 130° C., a reaction rate of 9 Å/min was obtained, and, at 190° C., a reaction rate of 31 Å/min was obtained.

TABLE 2

| solution temperature (° C.) | Cu etch rate in EG solvent (Å/min) | Cu etch rate in EG + piperazine solution (Å/min) | Cu etch rate in EG vapor (Å/min) | Cu etch rate in EG + piperazine vapor (Å/min) |
|---|---|---|---|---|
| 100 | 26 | 27 | 0 | 0 |
| 130 | 44 | 48 | 8 | 9 |
| 160 | 65 | 67 | 19 | 23 |
| 190 | 92 | 98 | 27 | 31 |

<Experiment Result with Respect to the Cu Thin Film Using Piperazine>

Table 3, below, summarizes a result of an experiment in which a 1,4,7-triazacyclononane (TACN) chelator compound including three NH groups was used. TACN is solid at an ambient temperature and has a melting point of 42° C. to 45° C. and a boiling point of 254° C. In order to make TACN liquid, a solution thereof was prepared. TACN was dissolved by mainly using ethylene glycol and was vaporized. To this end, the solutions were heated from 150° C. to 270° C. at intervals of 20° C. to generate vapors of the solutions.

An etching rate of the Cu thin film in the vapor generated from the solution of 150° C. was 34.7 Å/min, an etching rate of the Cu thin film in the vapor generated from the solution of 190° C. was 63 Å/min, and an etching rate of the Cu thin film in the vapor generated from the solution of 270° C. was 118.5 Å/min, which was the highest etching rate.

TABLE 3

| temperature (° C.) | Cu etch rate in EG vapor (Å/min) | Cu etch rate in EG + TACN vapor (Å/min) |
|---|---|---|
| 150 | 12.4 | 34.7 |
| 170 | 21 | 48.2 |
| 190 | 27 | 63 |
| 210 | 37.6 | 79.5 |
| 230 | 45.1 | 91 |
| 250 | 52.3 | 101.7 |
| 270 | 63.5 | 118.5 |

<Experiment Result with Respect to the Cu Thin Film Using 1,4,7-Triazacyclononane (TACN)>

In TABLE 4, below, the reactive etching rates with regard to the piperidine, ethylene glycol (EG), piperazine/EG, and TACN/EG solutions of Tables 1 to 3 and the Cu thin film are consolidated into one table and compared.

The temperatures of the solutions were different from each other, and it is difficult to directly compare the etching rates with each other. However, when the etching rates are compared with each other at the same temperature, the etching rate of the Cu thin film with respect to the piperidine solution was 88.4 Å/min at 150° C., which is highest, the etching rate of the Cu thin film with respect to the EG/TACN solution was 34.7 Å/min, and the etching rate of the Cu thin with respect to the EG/piperazine film solution was 23 Å/min at 160° C., which is lowest.

TABLE 4

| Temperature (° C.) | Cu reaction rate in piperidine vapor (Å/min) | Cu etch rate in EG vapor (Å/min) | Cu etch rate in EG + piperazine vapor (Å/min) | Cu etch rate in EG + TACN vapor (Å/min) |
|---|---|---|---|---|
| 90 | 0 | | | |
| 100 | | 0 | 0 | — |
| 120 | 52 | | | |
| 130 | | 8 | 9 | |
| 150 | 88.4 | 12.4 | | 34.7 |
| 160 | | 19 | 23 | |
| 170 | | 21 | | 48.2 |
| 190 | | 27 | 31 | 63 |
| 210 | | 37.6 | | 79.5 |
| 230 | | 45.1 | | 91 |
| 250 | | 52.3 | | 101.7 |
| 270 | | 63.5 | | 118.5 |

<Reactive Etching Rates Between Piperidine, Ethylene Glycol (EG), Piperazine/EG, and TACN/EG Solutions and the Cu Thin Film at Respective Temperatures>

Figure 3:
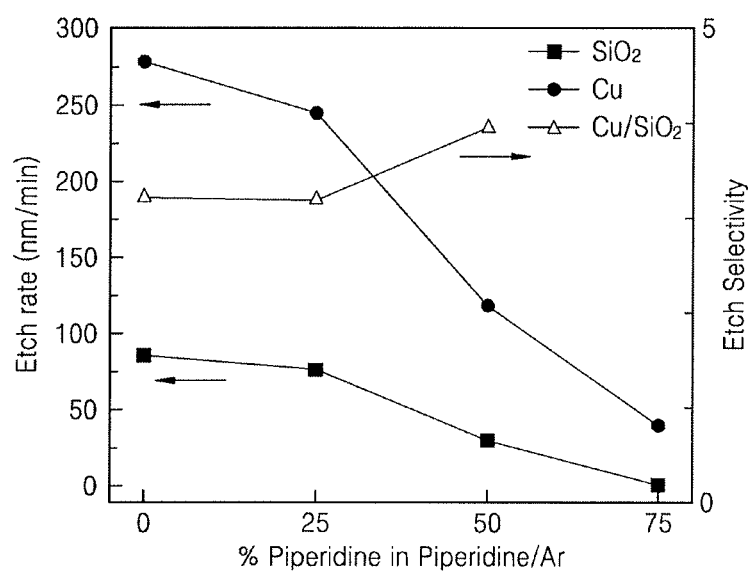
FIG. 3 illustrates a graph showing etching properties of a Cu thin film and an $SiO_2$ hard mask that were etched by using a piperidine/Ar gas by a high density plasma reactive ion etching method by changing the amount of piperidine and etch selectivity of the Cu thin film for the hard mask.

FIG. 3 illustrates a graph showing etching properties of a Cu thin film by an inductively coupled plasma reactive ion etching method while changing the amount of piperidine to 0 vol %, 25 vol %, 50 vol %, 75 vol %, and 100 vol % in the mixed gas of piperidine/Ar. As the concentration of piperidine increased, etching rates of the Cu thin film and the hard mask gradually decreased. When the amount of piperidine in the mixed gas was 75 vol %, the Cu thin film was etched and a small amount of deposition material was formed on the $SiO_2$ hard mask. When piperidine was used in an amount of 100 vol %, the Cu thin film was not etched.

Figure 4:
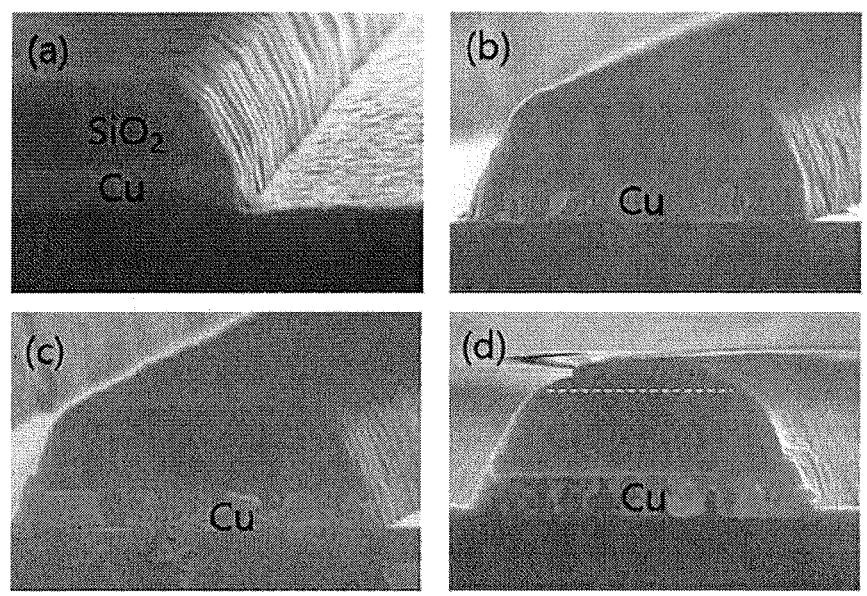
FIG. 4 illustrates etching profiles of a 1 μm line pattern etched using a piperidine/Ar gas by a high density plasma reactive ion etching method by changing the amount of piperidine for a $SiO_2$/Cu thin film.

FIG. 4 illustrates etching profiles of 1 μm line patterned $SiO_2$/Cu etched by an inductively coupled plasma reactive ion etching method while changing the amount of piperidine to 0 vol %, 25 vol %, 50 vol %, 75 vol %, and 100 vol=% in the mixed gas of piperidine/Ar. The etching profiles of $SiO_2$/Cu etched by (a) pure Ar, (b) 25 vol % piperidine, (c) 50 vol % piperidine, and (d) 75 vol % piperidine are illustrated. When the pure Ar gas was used, physical etching was performed by Ar ions, and a large amount of re-deposition occurred around the etched Cu thin film. When etching was performed by increasing piperidine from 25 vol % to 75 vol %, a re-deposition material gradually reduced on side walls of the Cu thin film and re-deposition did not occur when 75 vol % of piperidine was used. Sidewall slopes were 75, 72, and 70 degrees with respect to amounts of piperidine of 25 vol %, 50 vol %, and 75 vol %.

Figure 5:
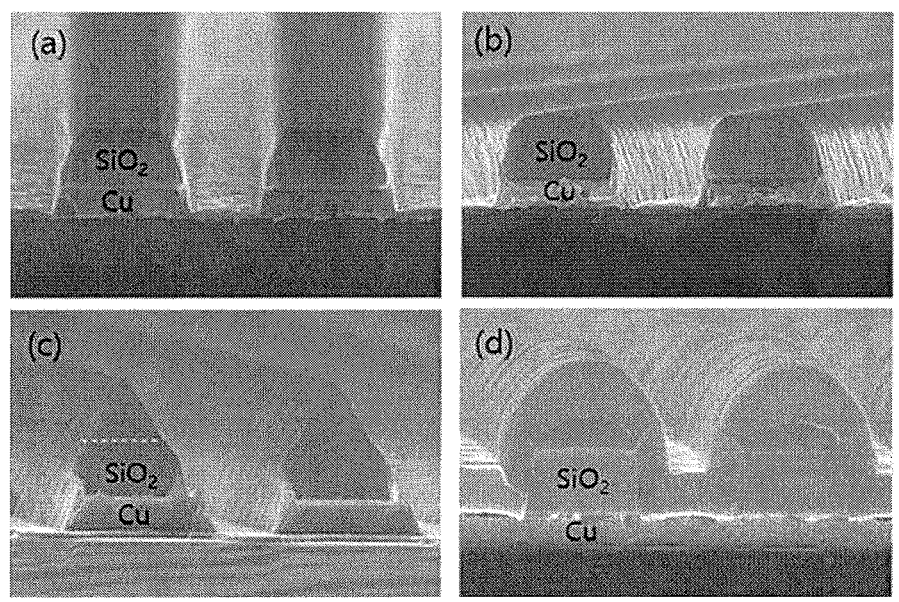
FIG. 5 illustrates etching profiles of a 0.5 μm (500 nm) line pattern etched using a piperidine/Ar gas by a high density plasma reactive ion etching method by changing the amount of piperidine for a $SiO_2$/Cu thin film.

FIG. 5 illustrates etching profiles of 0.5 μm (500 nm) line patterned $SiO_2$/Cu etched under the same condition of FIG. 4. As in the result obtained by the 1 μm pattern, when etching was performed by increasing piperidine from 25 vol % to 75 vol %, the re-deposition material was gradually reduced on the side walls of the Cu thin film, and, when 100 vol % of piperidine was used, the Cu thin film was not etched and a polymer film was deposited. The etching profiles of $SiO_2$/Cu etched by (a) 25 vol % piperidine, (b) 50 vol % piperidine, (c) 75 vol % piperidine, and (d) 100 vol % of piperidine are illustrated.

According to another embodiment, a method of etching a Cu thin film may include patterning a hard mask to mask the Cu thin film, forming a plasma of a mixed gas including piperidine, alcohol (R—OH), and inert gas, and etching the masked Cu thin film using plasma formed in the forming of the plasma of the mixed gas.

In the mixed gas, the concentration or amount of piperidine may be from about 5 vol % to about 20 vol %, etch selectivity of the Cu thin film with respect to the hard mask may be about 1 to about 3, and a sidewall slope may be about 70 degrees or more.

In an implementation, like in a case in which alcohol is not included in the mixed gas, the inert gas in the forming of the plasma of the mixed gas may include He, Ne, Ar, or $N_2$, and a temperature of a substrate may be about 10° C. to about 20° C. in the etching of the Cu thin film. Furthermore, a sidewall slope may be about 70 degrees or more.

Figure 6:
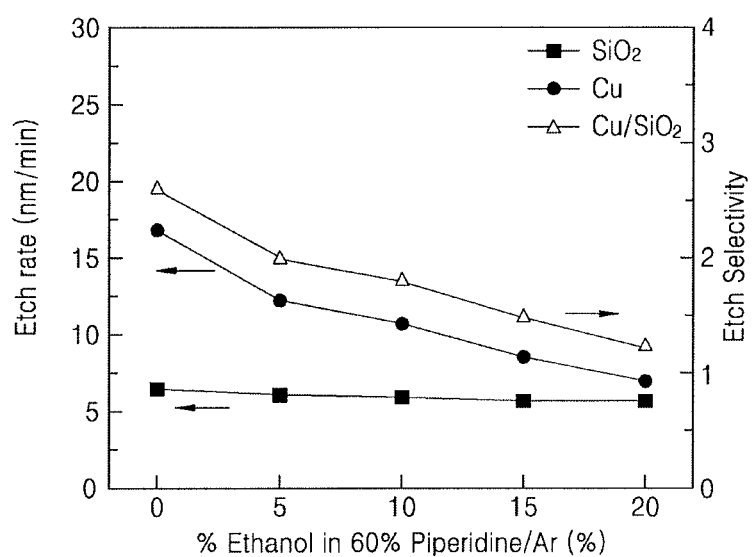
FIG. 6 illustrates a graph showing etching properties of a Cu thin film and an $SiO_2$ hard mask that are etched by using a $C_2H_5OH$/piperidine/Ar gas by a high density plasma reactive ion etching method by changing the concentration of $C_2H_5OH$ and etch selectivity of the Cu thin film for the hard mask.

FIG. 6 illustrates a graph showing etching properties of the Cu thin film by the inductively coupled plasma reactive ion etching method with adding $C_2H_5OH$ to a first mixed gas of 60 vol % of piperidine/Ar, while changing the amount of $C_2H_5OH$ to 0 vol %, 5 vol %, 10 vol %, 15 vol %, and 20 vol % in a second mixed gas of $C_2H_5OH$/piperidine/Ar. As the concentration of $C_2H_5OH$ increased, the etching rate of the Cu thin film was gradually reduced and etching rates of the $SiO_2$ hard mask did not significantly change. For example, etch selectivity of Cu with respect to the hard mask was gradually reduced.

Figure 7:
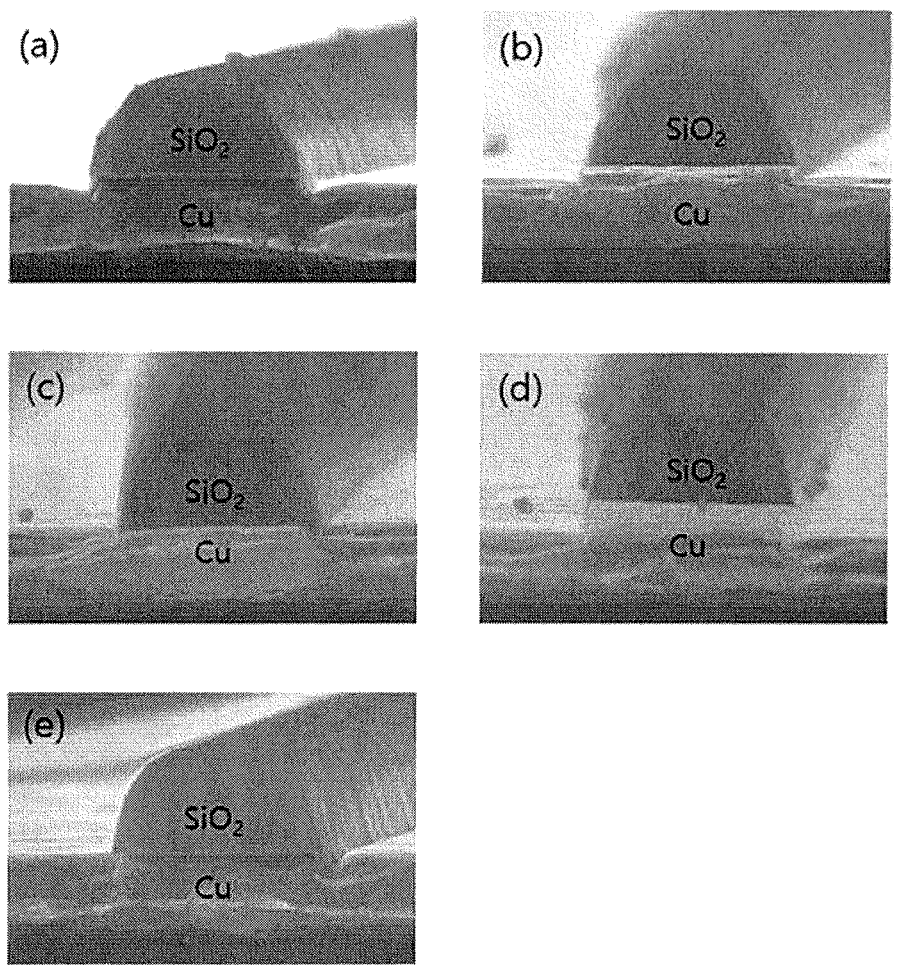
FIG. 7 illustrates etching profiles of a 0.5 μm (500 nm) line pattern etched using a $C_2H_5OH$/piperidine/Ar gas by a high density plasma reactive ion etching method by changing the amount of $C_2H_5OH$ for a $SiO_2$/Cu thin film.

FIG. 7 illustrates etching profiles of $SiO_2$/Cu etched by the inductively coupled plasma reactive ion etching method with adding $C_2H_5OH$ to a first mixed gas of 60 vol % piperidine/Ar (i.e., piperidine 60 vol %) while changing the amount of $C_2H_5OH$ to 0 vol %, 5 vol %, 10 vol %, 15 vol %, and 20 vol % in a second mixed gas of $C_2H_5OH$/piperidine/Ar. As the concentration of $C_2H_5OH$ increased, re-deposition after etching was significantly reduced. When the amount of $C_2H_5OH$ was 5 vol %, re-deposition was not observed. When the amount of $C_2H_5OH$ was 20 vol %, the sidewall slope of Cu is significantly increased to about 75 degrees or more. Etching profiles of $SiO_2$/Cu etched by (a) the first mixed gas (i.e., 60 vol % of piperidine/Ar), (b) $C_2H_5OH$ of 5 vol % in the second mixed gas, (c) $C_2H_5OH$ of 10 vol % in the second mixed gas, (d) $C_2H_5OH$ of 15 vol % in the second mixed gas, and (e) $C_2H_5OH$ of 20 vol % in the second mixed gas are illustrated.

By way of summation and review, it may be difficult to create a compound by using Cu, and dry etching may not be implemented and a special process referred to as a damascene process may be used. The resistance of an electrode may increase when a fine line width of a metal electrode or a metal wiring line is reduced to several nanometers (nm) even in the damascene process, and a dry etching process of Cu may be considered.

In some damascene processes, after forming a diffusion barrier on a semiconductor substrate including a trench, a Cu wiring line may be formed by depositing a Cu layer and performing chemical mechanical polishing (CMP) process. After patterning a hard mask on a Cu layer and masking the patterned hard mask, the Cu layer may be dry etched by using an etching system including Cl atoms and accordingly, a Cu metal wiring line may be manufactured.

A wet etching method or a dry etching method may be used for a process of etching thin films for performing fine patterning. As a size of patterns to be etched is reduced to no more than several micrometers, it may be difficult to apply the wet etching method. For example, the dry etching method, in which plasma faithful to transmitting the patterns is used, may be desirable.

The dry etching method, in which low pressure plasma is used, may be classified into an ion milling etching method and a reactive ion etching method by chemical reactivity of plasma. In the ion milling etching method, etching is performed by using argon (Ar) plasma that is an inert gas. In the reactive ion etching method, etching is performed by using various chemical gases.

Cl-based gases such as $SiCl_4$, $CCl_4$, $Cl_2$, and HCl may be used and an etching gas such as HBr may be applied. An etching rate of Cu may be very low, and hard masks such as a metal or an oxide layer may be used. When the Cl-based gases are used as the etching gases, an etching product of $CuCl_x$ may be generated. For example, rather than etching the Cu thin film, a layer of $CuCl_x$ may be grown on the Cu thin film and the Cu thin film may thicken, which may be observed by a scanning electron microscope (SEM). Such $CuCl_x$ compounds may be removed by an HCl solution or $H_2$ plasma processing. A final etched pattern of Cu may not be excellent and etching of a fine pattern may not be achieved.

By using hexafluoroacetylacetonate (hfac) that is a kind of an organic chelator material and heating a substrate to 90° C. to 160° C., an organic metal compound including hfac having low melting and boiling points and high volatility may be formed and accordingly, a Cu etching reaction may be easily performed. A fine pattern may not be successfully formed. Dry etching on a Cu thin film could be performed using a hydrogen gas at a low temperature, e.g., etching may be performed on the Cu thin film by using hydrogen and a mixed gas of hydrogen/argon under etching conditions.

When a Cu thin film is etched, in a case in which ion milling, in which an apparatus is simple and a physical etching mechanism is used, is used or a size of a pattern is no more than about 5 μm to about 10 μm, as illustrated in FIG. 1B, re-deposition could occur around the etched pattern and accordingly, a fence may be formed, which may be caused by the etching mechanism of the ion milling etching method, in which a part of a thin film material is sputtering and removed only by collision energy of Ar positive ions without a chemical reaction.

The dry etching process for the Cu thin film may be performed using new etching gases and optimal etching processes. For example, when the Cu thin film is etched in order to manufacture highly integrated devices, the reactive ion etching method, to which chemical reaction is applied, may be used. In addition, a high density plasma reactive ion etching method, in which plasma density is high and accordingly, an etching rate is high and etch selectivity may increase, may be used. For example, Cu has extremely small or no reactivity, an etching rate may be very low, and accordingly, etch selectivity of the Cu thin film with respect to an etching mask may be very small. For example, when photoresist is used as a mask in a lithography process, a Cu pattern etched under an etching condition may not be formed. For example, instead of photoresist, etching may be performed by using a thin film formed of a metal such as Ti, Ta, W, TiN, or Cr or a metal oxide such as $TiO_2$ or $SiO_2$, e.g., a hard mask.

The Cu thin film may be etched by the reactive ion etching method, and if an improper etching gas or an etching gas with improper density were to be used or an improper etching process were to be used, re-deposition could occur on side surfaces of the etched pattern. In addition, if etching were to be performed by using an etching gas that is not optimized or under an etching condition that is not optimized, the occurrence of re-deposition may be reduced. However, as illustrated in FIG. 1C, a slope of an etched side surface (a sidewall slope) could be very steep, and may not be applied to the etching of the fine pattern.

A Cu thin film etching technology according to an embodiment may be capable of providing a high etching rate and a high anisotropic etching profile by using a proper etching gas and controlling the density of the etching gas.

One or more embodiments may provide a method of etching a Cu thin film, in which an optimal etching process condition is applied to the Cu thin film by using an organic chelator material including an NH group.

One or more embodiments may provide a pattern formed by performing etching by using a dry etching method without patterning a copper (Cu) thin film used as a semiconductor material such as an electrode or a wiring line by a damascene process.

One or more embodiments may provide a method of etching a Cu thin film capable of preventing re-deposition from occurring and providing a high etching rate and an etching profile of high anisotropy without an etching residue by using an etching gas.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of etching a copper (Cu) thin film, the method comprising:
   patterning a hard mask layer on the Cu thin film to form a hard mask on the Cu thin film; and
   etching the Cu thin film through the hard mask using a plasma of a mixed gas;
   wherein the Cu thin film has a sidewall slope of 70° or greater after the etching, and
   wherein the mixed gas includes an inert gas and an organic chelator material including an amine group, the mixed gas not including a halogen gas or a halide gas.

2. The method as claimed in claim 1, wherein the organic chelator material includes piperidine, piperazine, 1,4,7-triazacyclononane, 1,4,7,10-tetraazacyclododecane, or 1,4,8,11-tetraazacyclotetradecane.

3. The method as claimed in claim 1, wherein the mixed gas includes the organic chelator material in an amount of 25 vol % to 75 vol %, based on a total volume of the mixed gas.

4. The method as claimed in claim 3, wherein the organic chelator material includes piperidine.

5. The method as claimed in claim 1, wherein the inert gas includes helium, neon, argon, or $N_2$.

6. The method as claimed in claim 1, wherein an etch selectivity of the Cu thin film with respect to the hard mask is about 3 to about 5.

7. The method as claimed in claim 1, wherein the hard mask includes $SiO_2$, $Si_3N_4$, titanium, titanium nitride, tantalum, tungsten, or amorphous carbon.

8. The method as claimed in claim 1, wherein:
   the Cu thin film is on a substrate, and
   in the etching of the Cu thin film, a temperature of the substrate is 10° C. to 20° C.

9. A method of etching a copper (Cu) thin film, the method comprising:
   providing the Cu thin film on a substrate;
   forming a hard mask layer on the Cu thin film;
   etching the hard mask layer to form a hard mask on the Cu thin film; and
   plasma etching the Cu thin film through the hard mask using plasma generated from a mixed gas including an inert gas and an organic chelator material including an amine group,
   wherein the Cu thin film has a sidewall slope of 70° or greater after the plasma etching.

10. The method as claimed in claim 9, wherein the mixed gas further includes an alcohol in an amount of 5 vol % to 20 vol %, based on a total volume of the mixed gas.

11. The method as claimed in claim 9, wherein the organic chelator material includes piperidine, piperazine, 1,4,7-triazacyclononane, 1,4,7,10-tetraazacyclododecane, or 1,4,8,11-tetraazacyclotetradecane.

12. The method as claimed in claim 9, wherein the mixed gas includes the organic chelator material in an amount of 25 vol % to 75 vol %.

13. The method as claimed in claim 12, wherein the organic chelator material includes piperidine.

14. The method as claimed in claim 9, wherein the mixed gas does not include a halogen-containing gas or a halide-containing gas.

15. The method as claimed in claim 9, wherein the hard mask includes $SiO_2$, $Si_3N_4$, titanium, titanium nitride, tantalum, tungsten, or amorphous carbon.

16. The method as claimed in claim 9, wherein the inert gas includes helium, neon, argon, or $N_2$.

17. The method as claimed in claim 9, wherein in the plasma etching of the Cu thin film, a temperature of the substrate is 10° C. to 20° C.

* * * * *